United States Patent [19]

Chen

[11] Patent Number: 4,860,438
[45] Date of Patent: Aug. 29, 1989

[54] SURFACE MOUNTING DEVICE PICK-AND-PLACE HEAD

[75] Inventor: Horng-Hwei Chen, Hsinchu Hsien, Taiwan

[73] Assignee: Industrial Technology Research Institute, Chatung, Taiwan

[21] Appl. No.: 160,943

[22] Filed: Feb. 9, 1988

[51] Int. Cl.⁴ .............................................. H05K 3/30
[52] U.S. Cl. ...................................... 29/740; 29/743; 294/2; 294/64.1
[58] Field of Search ................. 29/740, 741, 743, 759; 294/64.1, 2; 414/744 B

[56] References Cited

U.S. PATENT DOCUMENTS

4,515,507  5/1985  Asai et al. .................... 29/740 X
4,624,050  11/1986  Hawkswell ....................... 29/740

Primary Examiner—Carl E. Hall
Attorney, Agent, or Firm—Harness, Dickey & Pierce

[57] ABSTRACT

An SMD pick-and-place head for picking an SMD (Surface Mounting Device) and placing it on a predetermined location of a PC board automatically. An SMD pick-and-place head also automatically centers a picked up SMD, so as to place the SMD at a predetermined location precisely. The SMD pick-and-place head comprises a body shell, a nozzle device, a vacuum source, an elevating device, two couples of centering links, a centering link drive mechanism, and a nozzle rotation drive mechanism.

6 Claims, 8 Drawing Sheets

SURFACE MOUNTING DEVICE PICK-AND-PLACE HEAD

BACKGROUND OF THE INVENTION

The present invention relates to an apparatus having a pick-and-place head which picks up and places a surface mounting device (SMD) automatically, and especially to the construction of the pick-and-place head.

It is customary to fabricate a PC board by inserting the pins of an electronic component, such as an IC, into the holes formed on the PC board and then affixing the component on the PC board by soldering it on the PC board. However, it is necessary to drill holes on PC boards before fabrication, which induces a certain amount of workhours and needs some installations. Furthermore, the size of the PC board can not be made any smaller due to the presence of the interspaces between the holes formed on the PC board and the minimum limitation of diameter of the holes. A method of fabricating a PC board is here suggested, enabling the miniaturization of the size of the PC board by way of applying electronic components on the PC board directly, without inserting the pins of the components. The above components are called surface mounting devices (SMD) which are different from the traditional components in size and weight. An SMD is smaller and lighter than a traditional component, and the accuracy required during operation is higher than that of the traditional operation, so that an ordinary mechanical holding and centering mechanism can not meet the requirements, such as the positioning accuracy of picking up and placing the SMDs, during operation.

SUMMARY OF THE INVENTION

It is therefore an object of this invention to provide an SMD pick-and-place head for picking up an SMD and then placing it on a predetermined location of a PC board automatically.

It is another object of this invention to provide a SMD pick-and-place head for automatically centering a picked up SMD, so as to place the SMD on a predetermined location precisely.

In accordance with the present invention, an SMD pick-and-place head for picking and placing a surface mounting device (SMD) automatically, which comprises:
 a shell body;
 a nozzle device having an opening hole;
 a vacuum source for both producing and releasing vacuum pressure;
 a passageway having one end communicating with the opening of the nozzle device and the other end communicating with the vacuum source;
 at least one pair of centering links pivotally mounted on the shell body, having a cam follower mounted on each of a first end portion thereof, and a pad mounted on a second end portion thereof;
 means for driving the pads of each pair of the centering links to move toward or away from each other; and
 a mechanism engaging with the nozzle device and enclosed in the shell body for driving the nozzle device to move linearly between a first position and a second position, relative to the shell body, and actuating the driving means;
 when the nozzle device is at its second position, the vacuum source produces vacuum pressure to enable the nozzle device to hold the SMD by means of vacuum pressure, then the mechanism drives the nozzle device to move to its first position and subsequently actuates the means to drive the pads of each pair of the centering links to move toward each other in order to grab and center the SMD, then the mechanism actuates the means to drive the pads of each pair of the centering links to move away from each other to release the SMD and subsequently driving the nozzle device to move to its second position, finally the vacuum source releases vacuum pressure to enable the nozzle device to disengage from the SMD.

In accordance with the present invention, an SMD pick-and-place head comprises:
 a shell body;
 a nozzle device having an opening hole;
 a vacuum source for both producing and releasing vacuum pressure;
 a passageway having one end communicating with the opening of the nozzle device and the other end communicating with the vacuum source;
 at least one pair of centering links pivotally mounted on the shell body, having a cam follower mounted on each of a first end portion thereof, and a pad mounted on a second end portion thereof;
 means for driving the pads of each pair of the centering links to move toward or away from each other;
 an elevating mechanism engaging with the nozzle device and enclosed in the shell body for driving the nozzle device to move linearly between a first position and a second position, relative to the shell body, and actuating the driving means; and
 a rotation mechanism engaging with the nozzle device for driving, the nozzle device to rotate about its longitudinal axis;
 when the nozzle device is at its second position, the vacuum source produces vacuum pressure to enable the nozzle device to hold the SMD by means of vacuum pressure, then the rotation mechanism drives the nozzle device to rotate a predetermined angle, then the elevating mechanism drives the nozzle device to move to its first position and subsequently actuates the means to drive the pads of each pair of the centering links to move toward each other in order to grab and center the SMD, then the mechanism actuates the means to drive the pads of each pair of the centering links to move away from each other to release the SMD and subsequently drive the nozzle device to move to its second position, finally the vacuum source releases vacuum pressure to enable the nozzle device to disengage from the nozzle device.

Further objects, features and advantages of this invention will appear more fully in the following description.

BRIEF DESCRIPTION OF THE DRAWINGS

This invention will be explained in more detail on the basis of an examplary embodiment with reference to the drawings, in which.

DETAILED DESCRIPTION OF THE PREFERRED EMBODIMENT

Figure 1:
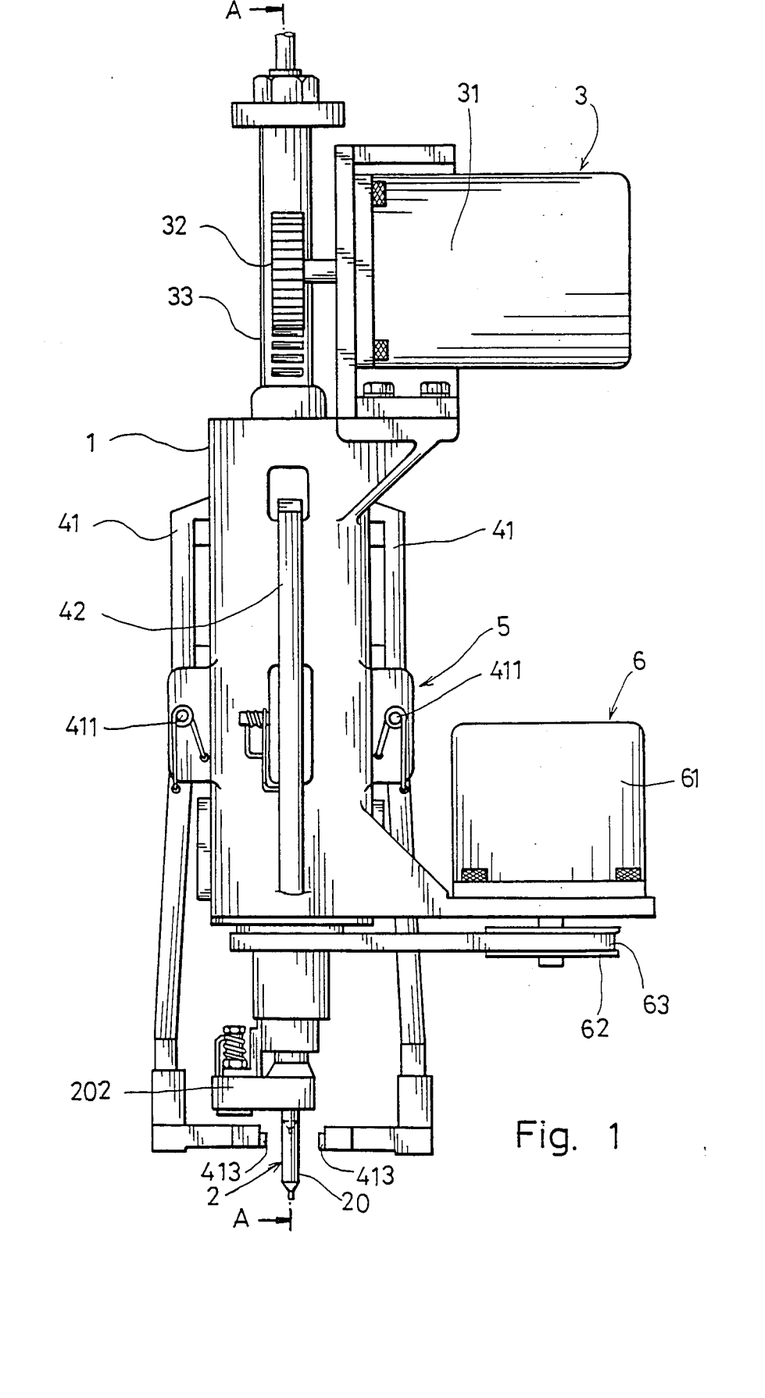
FIG. 1 is an elevational front view showing the outer shape of a preferred embodiment of the SMD pick-and-place head according to this invention.

As shown in FIG. 1, the SMD pick-and-place head of this invention comprises a body shell 1; a nozzle device 2; a vacuum source (not shown); an elevating device 3; two couples of centering links 41, 41, 42, 42; a centering link drive mechanism 5; and a nozzle rotation drive mechanism 6. The inner construction of the SMD pick and place head will be explained in detail with reference to the sectional view shown in FIG. 2 and the exploded perspective views shown from FIG. 5 to FIG. 8.

Figure 2:
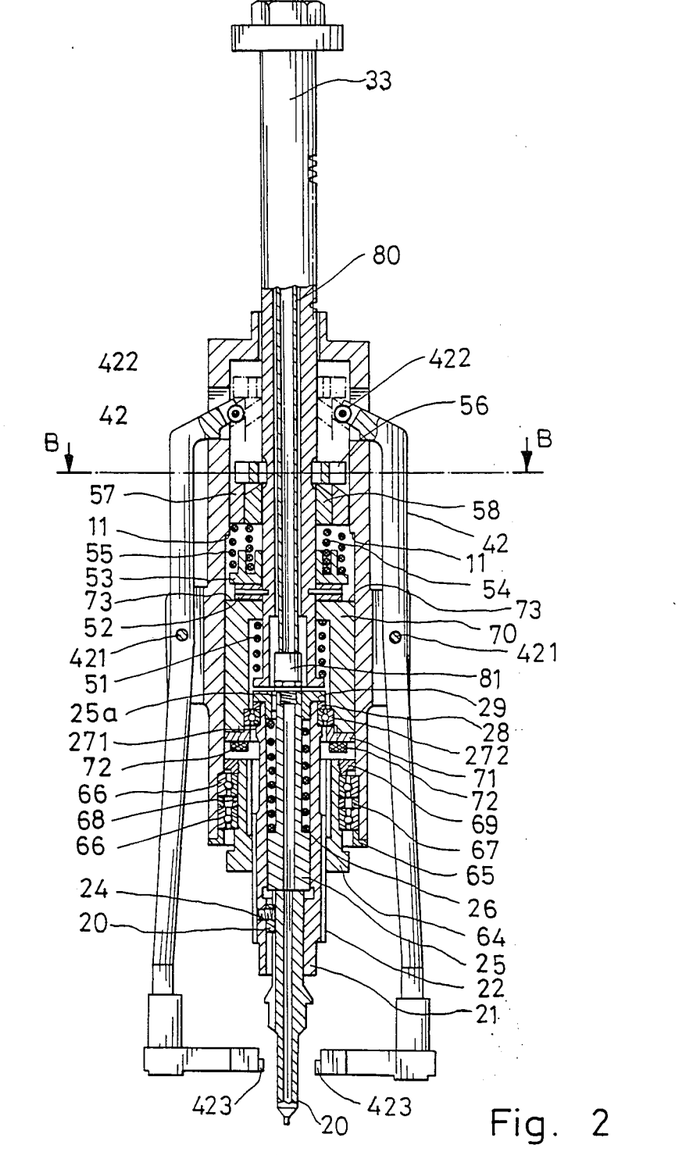
FIG. 2 is a sectional view along line A—A in FIG. 1, showing the interior construction, with some devices removed, of the SMD pick-and-place head shown in FIG. 1.
Figure 5:
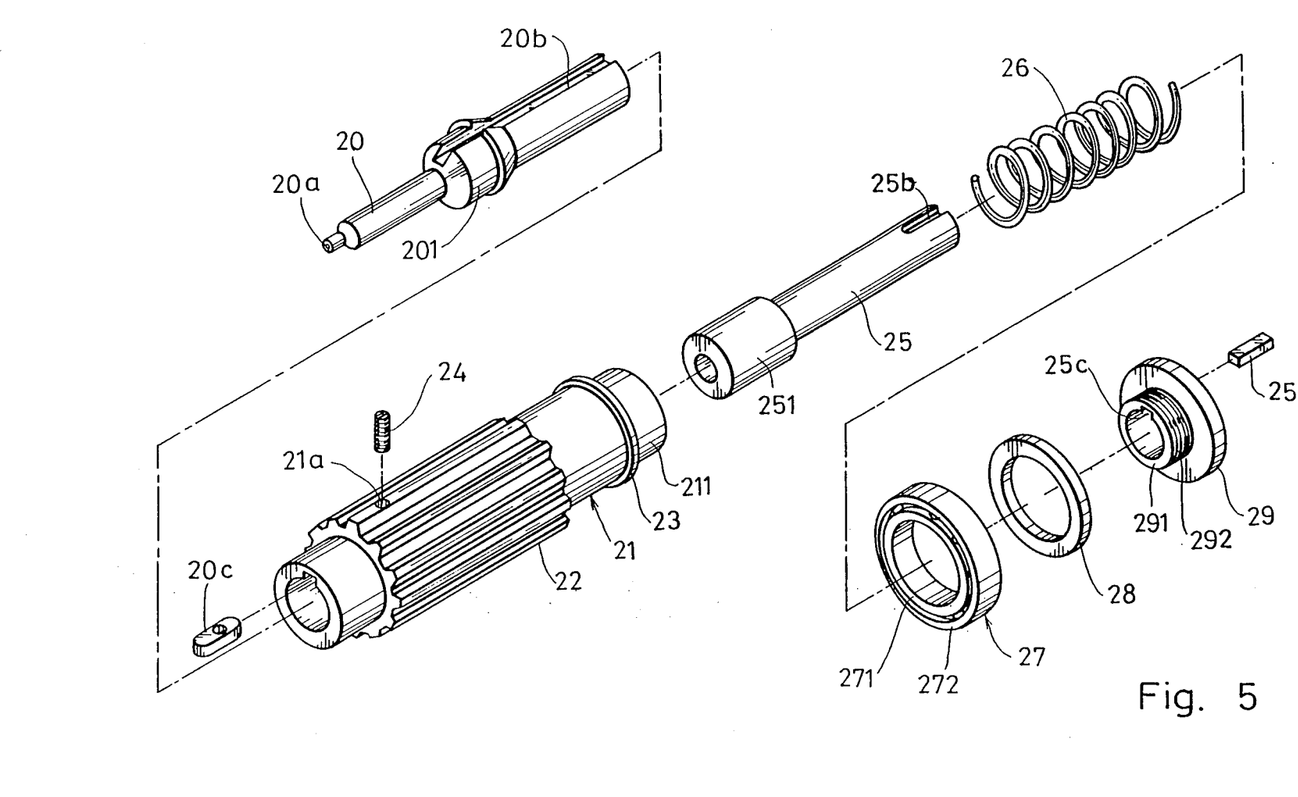
FIG. 5 is an exploded perspective view showing the construction in the vicinity of the nozzle device of this invention.
Figure 6:
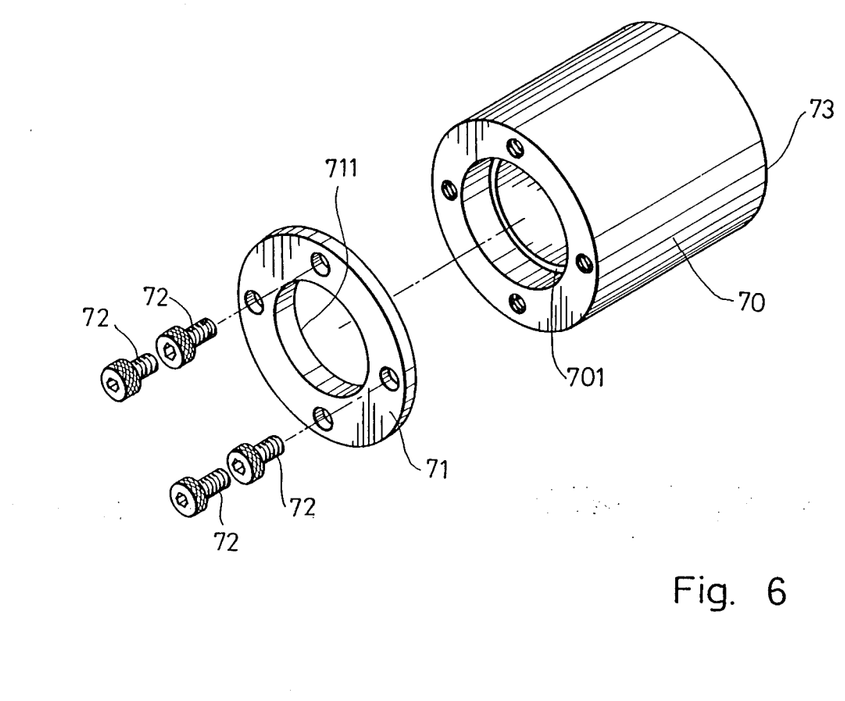
FIG. 6 is an exploded perspective view showing the construction of the coupling sleeve which is part of the connection device for connecting the nozzle device and the rack of elevating device of this invention.

As shown in FIG. 5, the nozzle head 20 is provided with an opening 20a and a channel communicating with the opening 20a (see FIG. 2). In addition, the nozzle head 20 is also provided with a keyway 20b for accommodating a key 20c which restricts the nozzle head 20 to slide relative to a sleeve member 21 along its longitudinal direction only, when the nozzle head 20 is assembled. Furthermore, the nozzle head 20 is clamped at its outer peripheral surface 201 by a clamp device 202 (see FIG. 1) fixed on the sleeve member 21, so that the bottom surface of a tube member 25 will urge the top surface of the nozzle head 20 under the expansion force of a coil spring 26 which is sleeved around the upper portion of the tube member 25. By this arrangement the nozzle head 20 will not drop down during operation. The key 20c is fastened by a screw 24 which extends through the hole 21a formed in the sleeve member 21. A spline portion 22 is provided on the outer surface of the sleeve member 21, which will match the inner spline slot 64a of a driven wheel 64 (see FIG. 7) of the nozzle rotation drive mechanism 6 (FIG. 1). When the driven wheel 64 is driven by a stepping motor 61 through a drive wheel 62 and a timing belt 63, the nozzle head 20 will also be driven to rotate around its longitudinal axis. The tube member 25 is provided with a keyway 25b which accommodates a key 25a together with a keyway 25c formed on the inner wall of the cap 29 (FIG. 5). When the SMD pick-and-place head is assembled, the key 25a will restrict the tube member 25 to slide upward and downward with respect to the sleeve member 21 along their longitudinal direction only. The coil spring 26 is constrained between the flange 251 formed on the lower portion of the tube member 25 and the bottom ridge 291 of the cap 29. When the tip of the nozzle head 20 is driven to move downward to butt the SMD, the coil spring 26 will absorb the shock to protect the nozzle head 20 and the SMD from deformation or breakage. When the SMD pick-and-place head is assembled, the bearing 27 is sleeved on the upper outer peripheral surface of the sleeve member 21 (see FIG. 2), and the inner race 271 is constrained between the flange 23 and a spacer 28 which is urged by the cap 29 and, at the same time, the outer race 272 is constrained between the cap 71 (FIG. 6) and inner rim 701 of the coupling sleeve 70. By this arrangement, when the coupling sleeve 70 is driven to move upward, the sleeve member 21 will be pulled upward simultaneously.

Figure 7:
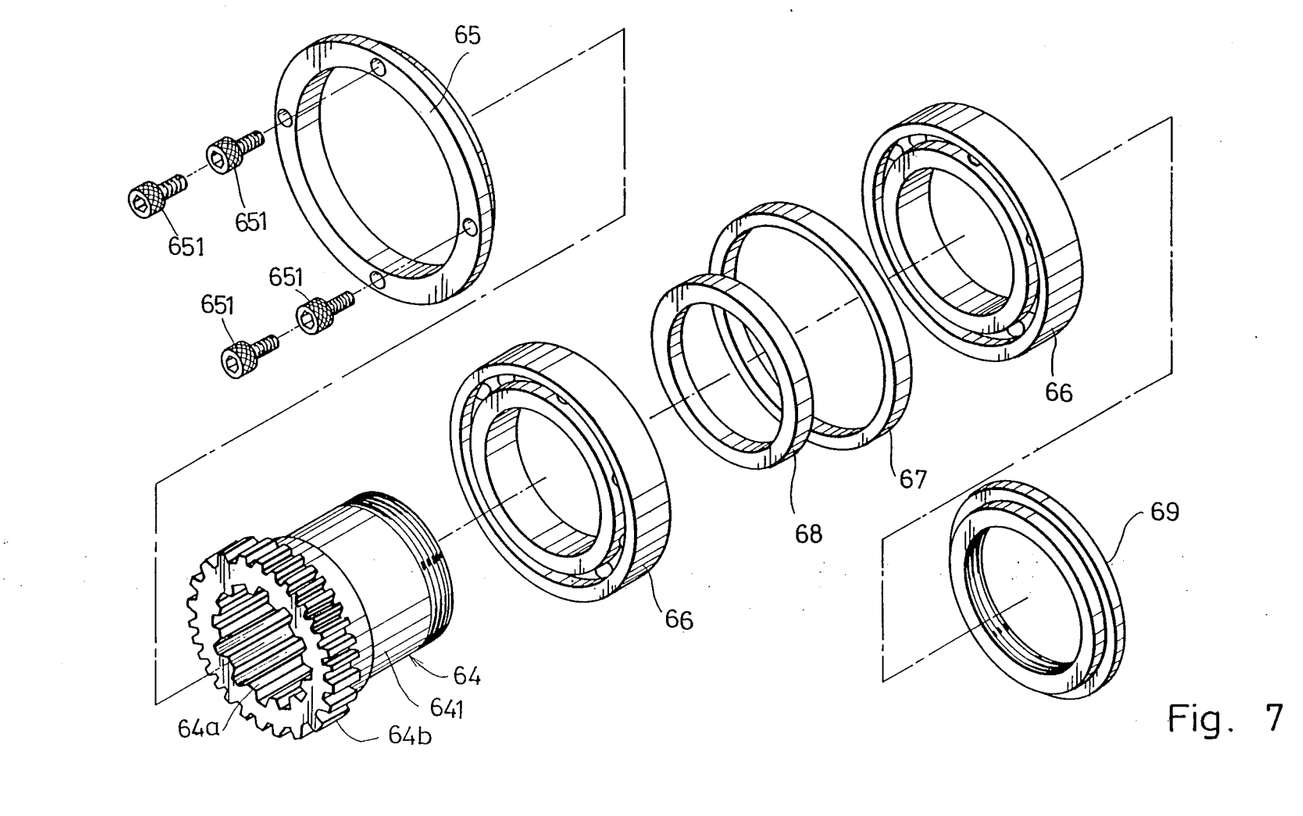
FIG. 7 is an exploded perspective view showing the construction of the bearing device of the nozzle rotation drive mechanism of this invention.

Now, in FIG. 7, the construction of the bearing device of the nozzle rotation drive mechanism of this invention is shown. As shown in FIG. 7, the bearing device comprises a driven wheel 64, one pair of bearings 66, 66, two spacers 67, 68, and a cap 69. The driven wheel 64 is provided with an inner spline slot 64a which matches the spline portion 22, so as to drive the sleeve member 21 to rotate integrally with it. It is to be noted that the sleeve member is still able to slide upward and downward with respect to the driven wheel 64. When assembled, the two bearing 66, 66 are spaced apart by two spacers 67, 68, which sleeve on the outer peripheral surface 641 of the driven wheel 64 in such a manner as to be constrained between two caps 65 and 69 (see FIG. 2). By this arrangement, the nozzle rotation driven mechanism will not drop down during operation. When the nozzle device 2 (see FIG. 1, including the nozzle head 20 and the tube member 25) is driven to rotate by the stepping motor 61, the driven wheel 64 will rotate integrally with the sleeve member 21 and the nozzle device 2 at the support of the bearing 66, 66, and 27.

Figure 8:
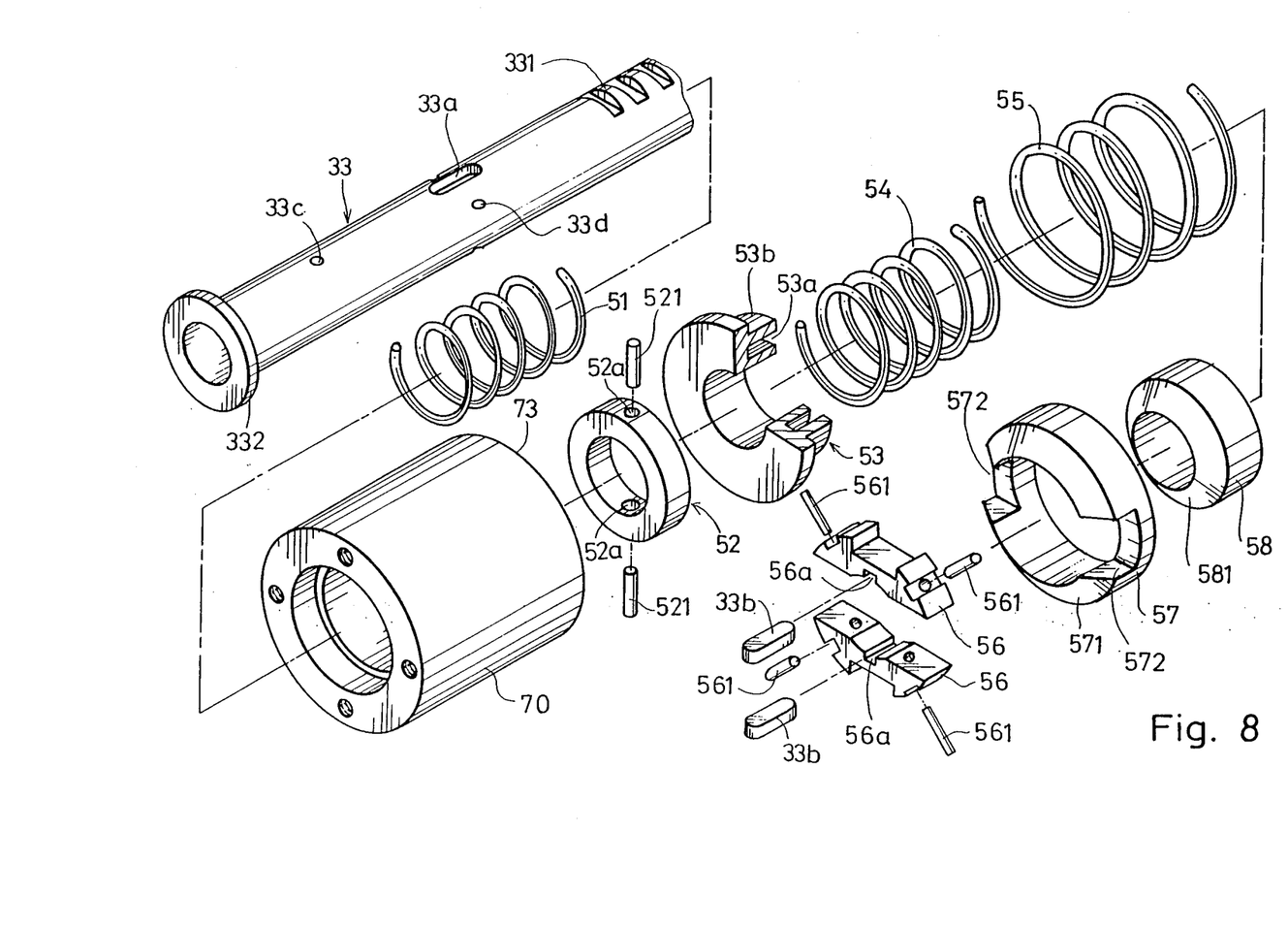
FIG. 8 is is an exploded perspective view showing the construction of the centering link drive mechanism of this invention.

Now, turn to FIG. 8 which shows the construction of the centering link drive mechanism of this invention. As shown in FIG. 8, the hollow rack 33 is provided with a teeth portion 331 on its outer surface, which meshes the pinion 32. When the stepping motor 31 rotates, the rack 33 will be driven by the pinion 32 to move upward or downward. Additionally, the rack 33 is provided with two keyways 33a, 33a on its outer surface, which accommdate two keys 33b, 33b together with two keyways 56a, 56a formed on one couple of cam stoppers 56, 56, respectively. The keys 33b, 33b will position the cam stoppers 56, 56 at their precise positions when the cam stopper 56, 56 are being secured to the rack 33 by four pins 561, 561. The rack 33 is provided with a flange 332 at its lower portion. When the rack 33 is inserted into the coupling sleeve 70, in the manner shown in FIG. 2, the flange 332 constrains a spring 51 together with the coupling sleeve 70. When the rack 33 is driven to move upward, the spring 51 will be urged to push the coupling sleeve 70, and the coupling sleeve 70 will be forced to move upward, and the nozzle device will be driven to move upward integrally. The stopper 52 is fixed to the rack 33 by means of inserting the pins 521, 52 into the holes 33c, 33c formed in the rack 33. The stopper 52 will obstruct the downward movement of the sprng receptacle 53 which accommodates the springs 54, 55 within the ring-shaped recesses 53a, 53b formed therein, so as to urge the cam ring 57, 58 having cam surface 571, 581 respectively on their top portions, against the cam stoppers 56, 56. that is, the springs 54, 55 are constrained between the spring receptacle 53 and the cam stoppers 56, 56. When the rack 33 is driven to move upward, all of the parts installed between the stoppers 52, 56, 56 will be driven to move upward integrally. It should be noted that the upper portion of centering links 41, 41 will enter into the slots 572, 572 formed in the cam ring 57 before the rollers mounted thereon contact the cam surface 581 of the cam ring 58.

The centering links 41, 41, 42, 42 are pivotally mounted on the body shell 1 by pins 411, 411, 421, 421, and each of the top portions of the centering links is provided with a roller, such as 422, 422. These rollers incorporate with the cam surfaces 571, 581 of the cam rings to urge the lower portions of the centering links to come close in pairs, when the rack 33 moves upward to drive the cam surfaces 571, 581 to push these rollers upward. The lower portions of the centering links is provided with pads 413, 413, 423, 423 for urging two pairs of opposite sides of the SMD picked up by the nozzle head 20. Each of the pins 411, 411, 421, 421 is provided with a coil spring therearound for urging the centering link against the rotation actuated by the cam rings.

The following is the description of the operation of the preferred embodiment of this invention.

Figure 3A:
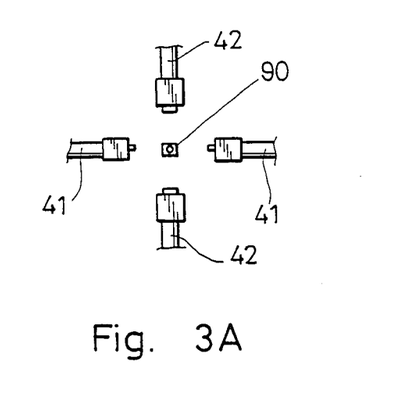
FIG. 3A and FIG. 3B are simplified top views showing the spatial relationships between an SMD and the tips of two pairs of centering links of the SMD pick-and-place head of this invention, before and after centering, respectively.
Figure 3B:
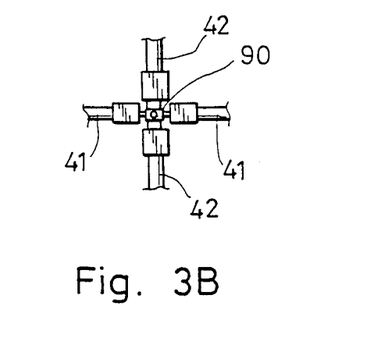
Figure 9:
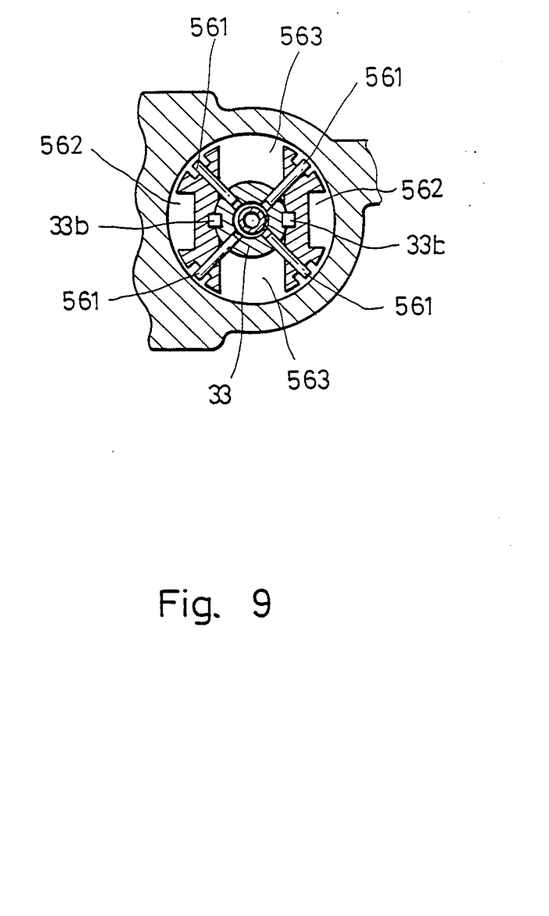
FIG. 9 is a sectional view along B—B line in FIG. 2.

When the nozzle head 20 is at its lower position (shown in solid line in FIG. 1) and the opening 20a of it contacts the upper surface of the SMD, the vacuum source will supply a vacuum pressure through a hose 80 to nozzle head 20 to enable the nozzle head 20 to pick the SMD by suction. The hose 80 being communicated with the vacuum source is connected to the tube member 25 by means of a joint 81, and the lower end surface of the tube member 25 is butted against the upper end surface of the nozzle head 20 by the spring 26, so that the vacuum pressure can reach the opening 20a of the nozzle head. The vacuum source will maintain the vacuum pressure to keep the SMD stuck on the nozzle head 20, then the stepping motor 31 will be actuated driving rack 33 to move upward. When the rack moves upward, the spring 51, the coupling sleeve 70, the sleeve member 21, and the nozzle device 2 will all be driven to move upward, and the outer peripheral rim 73 of the upper end surface of the coupling sleeve 70 will contact the protuded inner rim 11 formed on the inner wall of the shell body 1. The upward movement of the coupling sleeve 70 will be stopped instantly after the contact, and the nozzle device 2 moving integrally with the coupling sleeve 70 will also stop at its upper position shown in phantom line in FIG. 1. That is, the SMD stuck on the nozzle head 20 will be positioned at its upper position. If the stepping motor 31 continues driving the rack 33 to move upward, the flange 332 formed on the lower portion of the rack 33 will urge the spring 51, and the rack will continue moving upward and drive all of the parts installed between the stoppers 52, 56, 56 to move upward integrally. Before the cam rings 57, 58 come into contact with the rollers mounted on the upper portions of the centering links, the rollers will pass through the notch 562, 562, 563, 563 formed on the stoppers 56, 56, as shown in FIG. 9. The rollers mounted on the links 41, 41, 42, 42 are so arranged that the distances between the rollers mounted on the links 41, 41 are shorter than the distances between the rollers mounted on the links 42, 42. By this arrangement, the rollers mounted on the links 41, 41 will contact the cam surface 581, and the rollers mounted on the links 42, 42 will contact the cam surface 571, so as to actuate the two pairs of links independently. That is, if the shape of the SMD is rectangular, as shown in FIG. 3A, the pads 413, 413 of the links 41, 41 will touch one pair of the opposite sides of the SMD 90 first, and then the other pair of pads 423, 423 will subsequently touch the other pair at the oposite sides of the SMD 90.

After the contact, the center of the SMD 90 will align with the center of the nozzle device 2 exactly, and the SMD 90 will be precisely transfered to a predetermined location above a PC board by a conventional transfer device, such as a two dimensional positioning device. Then, the stepping motor 31 will be actuated to rotate in reversed direction to drive the rack 33 move downward, and the centering links 41, 41, 42, 42 will be driven to release the SMD 90. After which, the nozzle head 20 will be driven to butt the SMD 90 on the PC board in such a manner that the SMD 90 is located at its right place, and the vacuum source will subsequently release the vacuum pressure to disengage the SMD 90 from the nozzle head 20.

the SMDs are always supplied in such a manner that they are stuck on a continuous tape in juxtaposition. If the SMD picked up by the nozzle head is not in an attitude adapted for incorporating with the centering links 41, 41, 42, 42, the motor 61 of the nozzle rotation drive mechanism will be actuated to rotate the SMD to a predetermined angle to facilitate the operation of the centering links 41, 41, 42, 42.

Figure 4:
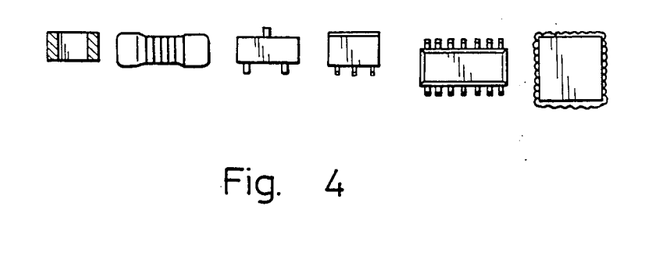
FIG. 4 is an elevational view showing the shapes of various SMDs suitable for being handled by the SMD pick-and-place head of this invention.

The shapes of various SMDs suitable for being handled by the SMD pick-and-place head of this invention are shown in FIG. 4.

As described above, the SMD pick-and-place head of this invention can pick up an SMD and then place it on a predetermined location of a PC board automatically.

Furthermore, the SMD pick-and-place head of this invention can automatically center a picked up SMD, and subsequently place the SMD on a predetermined location precisely.

Although the present invention has been described in its preferred form with a certain degree of particularity, it is understood that the present disclosure of the preferred form has been somewhat changed as concerns the details of construction and the conbination and arrangement of parts may be referred to without departing from the spirit and scope of the invention as hereinafter claimed.

What is claimed is:

1. An SMD pick-and-place head for picking up and placing a surface mounting device (SMD) automatically, which comprises:
   a shell body;
   a nozzle device having an opening hole;
   a vacuum source for both producing and releasing vacuum pressure;
   a passageway having one end communicating with said opening of said nozzle device and the other end communicating with said vacuum source;
   at least one pair of centering links pivotally mounted on said shell body, having a cam follower mounted on each of a first end portion thereof, and a pad mounted on a second end portion thereof;
   pad driving means for driving the pads of each pair of said centering links to move toward or away from each other; and
   a mechanism engaging with said nozzle device and enclosed in said shell body for drawing said nozzle device to move linearly between a first position and a second position, relative to said shell body, and actuating said pad drawing means;
   wherein said mechanism comprises:
   a stepping motor disposed in such a manner that it moves integrally with said shell body, having a drive shaft;
   a pinion connected to said drive shaft;

a rack slidably mounted on said shell body for meshing with said pinion, so as to be driven to slide relative to said shell body by said stepping motor; and a coupling device for coupling said rack and said nozzle device; said coupling device comprising:

a flange formed in one end portion of said rack, having a first receptacle surface;

a coupling sleeve sleeved around the outer peripheral surface of said rack above said flange, having a second receptacle surface formed therewithin opposite to said first receptacle surface of said flange and a connecting portion connected with said nozzle device for drawing said nozzle device to move integrally;

a stopper formed within said shell body for engaging with said coupling sleeve to restrict the upward movement of said coupling device; and a first spring member constrained between said first receptacle surface of said flange and said second receptacle surface of said coupling sleeve, for enabling said rack to move upward relative to said coupling sleeve when said coupling sleeve is engaged with said stopper;

such that when said nozzle device is at its second position, said vacuum source produces vacuum pressure to enable said nozzle device to hold said SMD by means of vacuum pressure, then said mechanism drives said nozzle device to move to its first position and subsequently actuates said pad driving means to drive said pads of each pair of said centering links to move toward each other in order to grab and center said SMD, then said mechanism actuates said pad driving means to drive said pads of each pair of said centering links to move away from each other to release said SMD and subsequently drawing said nozzle device to move to its second position, finally said vacuum source releases vacuum pressure to enable said nozzle device to disengage from said SMD.

2. An SMD pick-and-place head as claimed in claim 1, wherein said driving means comprises:

at least one coil spring sleeved around said rack;

a receptacle member fixed relative to said rack for receiving a first end portion of said coil spring;

at least one cam ring sleeved around said rack and mounted on a first end surface of said coil spring, having a cam surface formed on a first surface thereof for actuating said cam follower of said centering links; and when said rack moves upward, said spring members are pushed upward by said receptacle member, and subsequently pushing said cam ring upward to actuate said cam follower to urge said pads of said centering links to come close in pairs.

3. An SMD pick-and-place head as claimed in claim 2, wherein each pair of the centering links are actuated by each of said cam rings independently.

4. An SMD pick-and-place head as claimed in claim 1, wherein said centering links are two pairs and are interposed at a 90 degree angular distance with each other.

5. An SMD pick-and-place head as claimed in claim 2, wherein said centering links are two pairs and are interposed at a 90 degree angular distance with each other.

6. An SMD pick-and-place head as claimed in claim 3, wherein said centering links are two pairs and are interposed at a 90 degree angular distance with each other.

* * * * *